(12) United States Patent
Kim (10) Patent No.: US 7,457,185 B2
(45) Date of Patent: Nov. 25, 2008

(54) SEMICONDUCTOR MEMORY DEVICE WITH ADVANCED REFRESH CONTROL

(75) Inventor: Jee-Yul Kim, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 302 days.

(21) Appl. No.: 11/525,013

(22) Filed: Sep. 22, 2006

(65) Prior Publication Data

US 2007/0070765 A1 Mar. 29, 2007

(30) Foreign Application Priority Data

Sep. 29, 2005 (KR) ............... 10-2005-0090942
May 31, 2006 (KR) ............... 10-2006-0049139

(51) Int. Cl.
*G11C 7/00* (2006.01)

(52) U.S. Cl. .................. 365/222; 365/230.09

(58) Field of Classification Search ............ 365/222, 365/230.09, 230.03
See application file for complete search history.

(56) References Cited

U.S. PATENT DOCUMENTS

| | | | |
|---|---|---|---|
| 5,999,473 A * | 12/1999 | Harrington et al. ...... | 365/222 |
| 6,760,806 B2 | 7/2004 | Jeon | |
| 6,950,364 B2 | 9/2005 | Kim | |
| 6,956,782 B2 * | 10/2005 | Hoehler ............ | 365/222 |
| 6,992,943 B2 | 1/2006 | Hwang et al. | |
| 2004/0100847 A1 | 5/2004 | Derner et al. | |
| 2005/0270874 A1 | 12/2005 | Hur et al. | |
| 2006/0104319 A1 | 5/2006 | Smith et al. | |
| 2007/0022245 A1 * | 1/2007 | Sohn et al. .......... | 711/106 |

FOREIGN PATENT DOCUMENTS

| | | |
|---|---|---|
| KR | 2000-0052491 | 8/2000 |
| KR | 2003-0009125 | 1/2003 |
| KR | 2003-0091657 | 12/2003 |
| KR | 10-2004-0072260 | 8/2004 |

* cited by examiner

*Primary Examiner*—Vu A Le
(74) *Attorney, Agent, or Firm*—McDermott Will & Emery LLP (57) ABSTRACT

A semiconductor memory device having a plurality of banks performs a refresh operation in sequence to each bank whether the refresh operation is required for all or less than all of the banks. The semiconductor memory device includes an extended mode register set containing a refresh information of each bank; and a bank refresh block for supporting a refresh operation performed in sequence to each bank in response to the refresh information of each bank.

15 Claims, 5 Drawing Sheets

SEMICONDUCTOR MEMORY DEVICE WITH ADVANCED REFRESH CONTROL

FIELD OF INVENTION

The present invention relates to a semiconductor memory device; and, more particularly, to control a refresh operation to plural banks included in the semiconductor memory device.

DESCRIPTION OF RELATED ART

A dynamic random access memory (DRAM) semiconductor device typically contains a plurality of unit cells, each comprising a transistor and a capacitor. The device requires a refresh operation for preventing data loss because the capacitor is gradually discharged as time passes. Accordingly, the DRAM performs the refresh operation periodically and, thus, consumes power for the periodical refresh operation.

In a system, particularly portable devices such as a notebook computer, a personal digital assistant (PDA) and the like, it is important to reduce power consumption not only in operation but also at idle state or stand-by state. If the system includes the DRAM, the DRAM performs the refresh operation at idle state or stand-by state in order to maintain data; thus, the system consumes electric power at idle state or stand-by state continuously. Therefore, how to reduce power consumption without data loss during idle or stand-by state is important to the system including the DRAM.

Generally, since plural banks having a plurality of unit cells are simultaneously enabled in a self refresh operation, high peak current is consumed repeatedly. Thus, for reducing power consumption, all banks are enabled orderly or in sequence when a refresh operation is performed to all banks. When a refresh operation is performed to only a part selected from all banks, a piled refresh, in which a refresh operation is simultaneously performed to the part, is executed.

Figure 1:
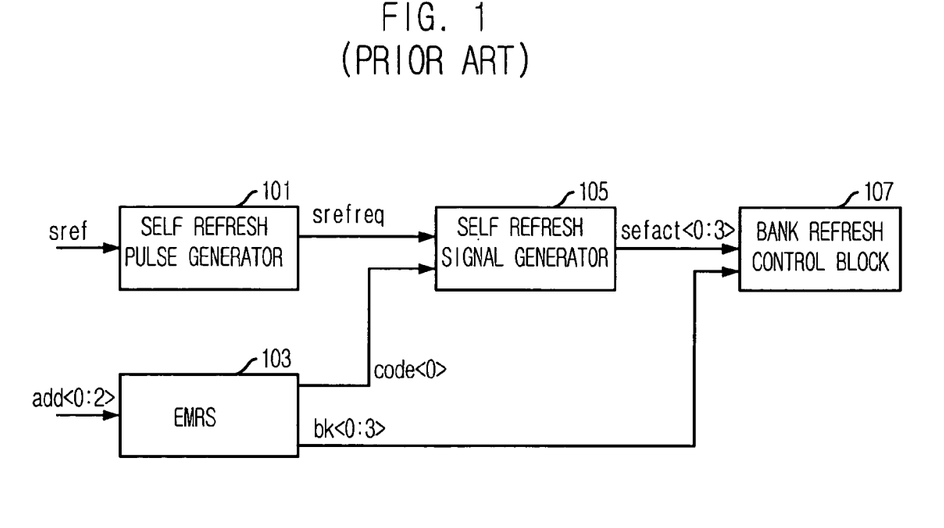
FIG. 1 is a block diagram of a refresh control block included in a conventional semiconductor memory device.

FIG. 1 is a block diagram of a refresh control block for a conventional semiconductor memory device. Herein, it is assumed that the conventional semiconductor memory device includes four banks.

As shown, the conventional semiconductor memory device includes a self refresh pulse generator 101, an extended mode register set 103 (referred to EMRS), a self refresh signal generator 105, and a bank refresh control block 107 which is included in each bank.

The self refresh pulse generator 101 generates a self refresh pulse srefreq in response to a self refresh source signal serf. In response to an address signal add<0:2>, the EMRS 103 outputs a bank selection signal bk<0:3> and only selected bank information signal code<0>, based on an array self refresh code which contains information in which bank among a plurality of banks a refresh operation should be performed. The self refresh pulse srefreq is input to the self refresh signal generator 105. The self refresh signal generator 105 generates a self refresh enable signal sefact<0:3> for activating four banks in sequence, wherein the self refresh enable signal sefact<0:3> is generated regardless of a refresh operation performed in all or any of the banks. The bank refresh control block 107 performs the refresh operation responsive to the self refresh enable signal sefact<0:3> and the bank selection signal bk<0:3>.

Since the self refresh signal generator 105 receives only selected bank information signal code<0>, the conventional semiconductor memory device can perform a piled refresh operation to all banks, not to fewer than all banks. When four banks, i.e., all banks, become refreshed, four banks can be enabled in sequence for the refresh operation. However, when only two of banks are to be refreshed, the two banks cannot be enabled in sequence, but are enabled simultaneously and the piled refresh operation is not performed. For reference, the array self refresh code code<0:7> generated from the EMRS 103 is described in accordance with the following table. The conventional semiconductor memory device shown in FIG. 1 uses only the selected bank information signal code<0> among the array self refresh code code<0:7>, for the piled refresh operation.

TABLE 1

Description of Array Self Refresh Code

| First address add<0> | Second address add<1> | Third address add<2> | Banks requiring refresh operation | code<0:7> |
|---|---|---|---|---|
| 0 | 0 | 0 | Banks 0 to 3 | 0 |
| 0 | 0 | 1 | Banks 0 and 1 | 1 |
| 0 | 1 | 0 | Bank 0 | 2 |
| 0 | 1 | 1 | Reserved | 3 |
| 1 | 0 | 0 | Banks 1 to 3 | 4 |
| 1 | 0 | 1 | Banks 2 and 3 | 5 |
| 1 | 1 | 0 | Bank 3 | 6 |
| 1 | 1 | 1 | Reserved | 7 |

Herein, the piled refresh operation of the semiconductor memory device is described referring to FIG. 1.

In response to the self refresh source signal serf generated by a refresh command, the self refresh pulse srefreq is output from the self refresh pulse generator 101. Then, the address signal add<0:2> determines in which bank the refresh operation is performed by the preset array self refresh code code<0:7> for the pile refresh operation. Based on banks requiring the refresh operation, the bank selection signal bk<0:3> is generated and output from the EMRS 103 to the bank refresh control block 107. Also, one of the preset array self refresh code code<0:7>, i.e., the selected bank information signal code<0>, which indicates whether or not all banks are refreshed is output to the self refresh signal generator 105. Referring to the above described table 1, the selected bank information signal code<0> means that the refresh operation is performed in all banks.

The self refresh signal generator 105 outputs the self refresh enable signal sefact<0:3> based on the self refresh pulse srefreq, wherein each bit of the self refresh enable signal sefact<0:3> is activated in sequence. If the refresh operation is performed in all banks, each bit of the self refresh enable signal sefact<0:3> is activated in advance and delivered to the bank refresh control block 107. On the contrary, if the refresh operation is performed in some banks, not all banks, each bit of the self refresh enable signal sefact<0:3> is activated simultaneously and delivered to the bank refresh control block 107.

Any bank among four banks are selected and enabled by the bank selection signal bk<0:3>, and unit cells of the selected bank are refreshed by the self refresh enable signal sefact<0:3>.

Hereinafter, the self refresh signal generator 105 for controlling above described refresh operation is depicted in detail.

Figure 2:
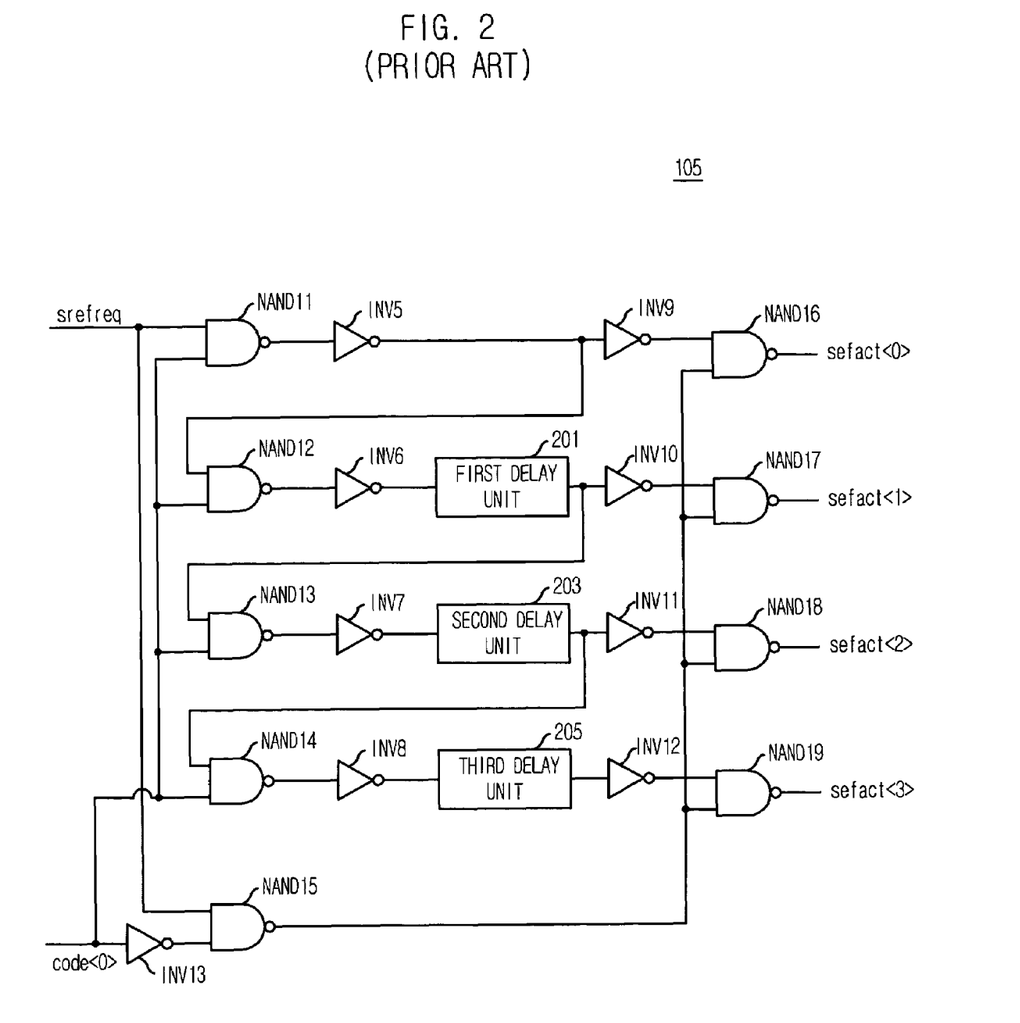
FIG. 2 is a schematic circuit diagram of a self refresh signal generator included in the conventional semiconductor memory device shown in FIG. 1.

FIG. 2 is a schematic circuit diagram of the self refresh signal generator 105 included in the conventional semiconductor memory device shown in FIG. 1. Herein, the self refresh signal generator 105 is designed in order to be optimized for the semiconductor memory device having four banks.

As shown, the self refresh signal generator 105 includes plural logic NAND gates NAND11 to NAND19, plural inverters INV5 to INV13, and plural delay units 201, 203, and 205.

The self refresh signal generator 105 receives the self refresh pulse srefreq to generate a first self refresh enable signal sefact<0>, a second self refresh enable signal sefact<1>, and a third self refresh enable signal sefact<2> controlled by the selected bank information signal code<0>.

If the selected bank information signal code<0> is activated, i.e., the refresh operation is performed to all banks, the first self refresh enable signal sefact<0> is first enabled. After a delay amount preset in a first delay unit 201 from a timing of enabling the first self refresh enable signal sefact<0>, the second self refresh enable signal sefact<1> is enabled secondly. Likewise, after a delay amount preset in a second delay unit 203, the third self refresh enable signal sefact<2> becomes enabled thirdly; finally, the fourth self refresh enable signal sefact<3> is enabled after some delay amount determined by a third delay unit 205.

On the contrary, if the selected bank information signal code<0> is not activated, i.e., the refresh operation is performed to one or some of the banks, but not all, the first to fourth self refresh enable signals sefact<0> to sefact<3> are simultaneously enabled based on the self refresh pulse srefreq.

As a result, based on whether the selected bank information signal code<0> is activated or not, the first to fourth self refresh enable signals sefact<0> to sefact<3> are enabled in sequence or simultaneously.

Thus, when the refresh operation is needed in all banks, the pile refresh operation can be performed by the first to fourth self refresh enable signals sefact<0> to sefact<3> which are enabled in sequence; the conventional semiconductor memory device may reduce peak current at the refresh operation.

However, as reduction of power consumption in the semiconductor memory device is required, peak current should not be increased unnecessarily when an enabled self refresh enable signal is input for refreshing fewer than all banks.

For example, when another selected bank information signal code<4> (referring to table 1, first to third banks require the refresh operation) is selected among the array self refresh code code<0:7> in the EMRS 103, the self refresh signal generator 105 cannot meet this situation effectively; as a result, three banks of all four banks in the conventional semiconductor memory device are simultaneously refreshed and, finally, peak current consumed therein is increased rapidly.

Therefore, in a semiconductor memory device having plural banks and operated in a low power system, an apparatus for decreasing a peak current on the refresh operation is required in order to reduce power consumption.

SUMMARY OF THE INVENTION

It is, therefore, an object of the present invention to provide an apparatus for decreasing peak current on the refresh operation to all or some banks of a semiconductor memory device having plural banks and operated in a low power system.

It is, therefore, another object of the present invention to provide a semiconductor memory device, which has plural banks and is operated in a low power system, for performing a refresh operation in sequence to each bank when the refresh operation is required to all or some banks therein.

In accordance with an aspect of the present invention, there is provided a semiconductor memory device including plural banks; an extended mode register set containing a refresh information of each bank; and a bank refresh block for supporting a refresh operation performed in sequence to each bank in response to the refresh information of each bank when the refresh operation is performed to at least two banks.

BRIEF DESCRIPTION OF THE DRAWINGS

The above and other objects and features of the present invention will become better understood with respect to the following description of the specific embodiments given in conjunction with the accompanying drawings, in which.

DETAILED DESCRIPTION OF THE INVENTION

Hereinafter, a semiconductor memory device in accordance with specific embodiments of the present invention will be described in detail with reference to the accompanying drawings.

Figure 3:
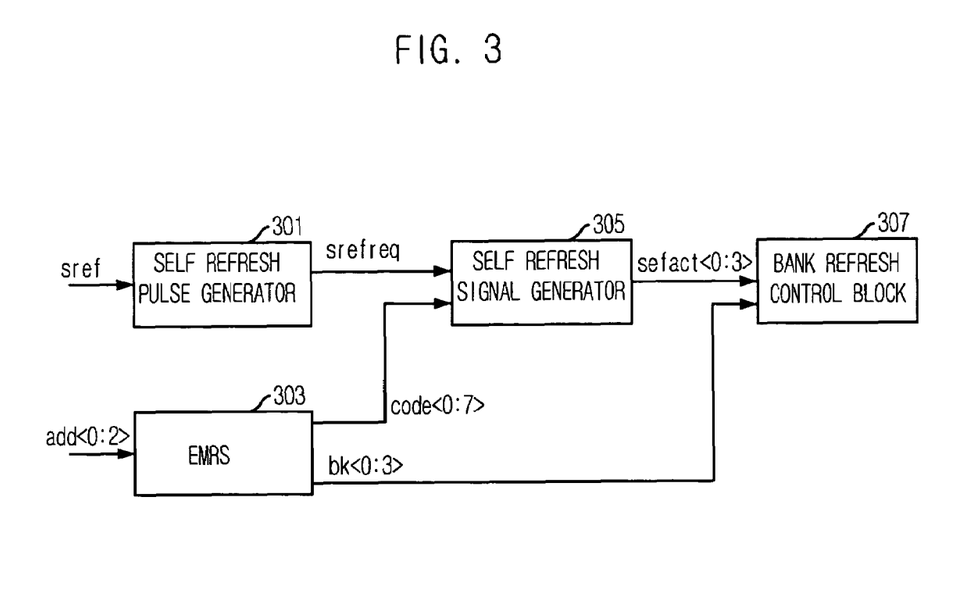
FIG. 3 is a block diagram of a semiconductor memory device according to an embodiment of the present invention.

FIG. 3 is a block diagram showing a semiconductor memory device according to an embodiment of the present invention. Herein, it is assumed that the semiconductor memory device includes four banks.

As shown, the semiconductor memory device includes an extended mode register set 303 (hereinafter, referred to EMRS) and a bank refresh block for supporting a refresh operation performed in sequence to each bank in response to the refresh information of each bank when the refresh operation is performed to at least two banks. In detail, bank refresh block includes a self refresh pulse generator 301, a self refresh signal generator 305, and a bank refresh control block 307 which is included in each bank.

The self refresh pulse generator 301 generates a self refresh pulse srefreq in response to a self refresh source signal serf. In response to an address signal add<0:2>, the EMRS 303 outputs a bank selection signal bk<0:3> and an array self refresh code code<0:7> based on an array self refresh code which contains information in which bank among a plurality of banks a refresh operation should be performed. The self refresh pulse srefreq is input to the self refresh signal generator 305. The self refresh signal generator 305 generates a self refresh enable signal sefact<0:3> for activating four banks in sequence, wherein the self refresh enable signal sefact<0:3> is generated regardless of a refresh operation performed in all or less than all of banks. The bank refresh control block 307 performs the refresh operation responsive to the self refresh enable signal sefact<0:3> to one or more banks selected by the bank selection signal bk<0:3>.

The array self refresh code code<0:7> generated from the EMRS 303 includes plural information signals, each including the refresh information of each bank. For example, the array self refresh code code<0:7> can be the same as that described in above table 1. Also, the refresh enable signal sefact<0:3> has plural bit signals which are activated in sequence.

The refresh enable signal generator 305 shown in FIG. 3 includes a sequential pulse generator for generating plural sequential pulses active<0:3> based on the refresh pulse and four decoders, i.e., first to fourth decoders, each generating the bit signal of the refresh enable signal sefact<0:3> based on the plural sequential pulses active<0:3> and the array self refresh code code<0:7>. Herein, the refresh enable signal generator 305 is described in detail, referring to drawings.

FIGS. 4A to 4D are schematic circuit diagrams of the self refresh signal generator 305 included in the conventional semiconductor memory device shown in FIG. 3.

Figure 4A:
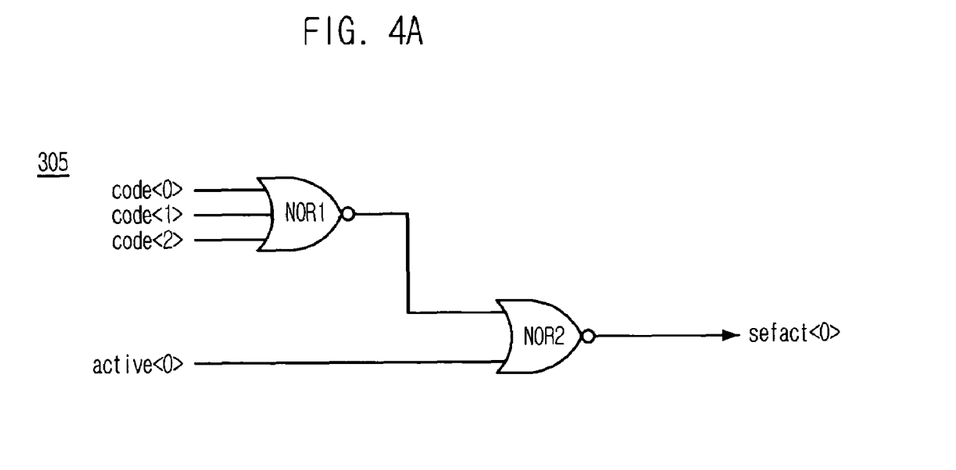
FIGS. 4A to 4D are schematic circuit diagrams for a self refresh signal generator included in the conventional semiconductor memory device shown in FIG. 3.

Referring to FIG. 4A, the first decoder of the first to fourth decoders included in the self refresh signal generator 305 includes a first logic NOR gate NOR1 for performing a logic NOR operation to first to third information signals code<0> to code<2> among the array self refresh code code<0:7> and a second logic NOR gate NOR2 for performing a logic NOR operation to a first sequential pulse active<0> and an output of the first logic NOR gate NOR1 to thereby generate a first bit signal sefact<0> of the refresh enable signal sefact<0:3>. The first sequential pulse active<0> is generated from the sequential pulse generator (not shown) included in the self refresh signal generator 305.

Figure 4B:
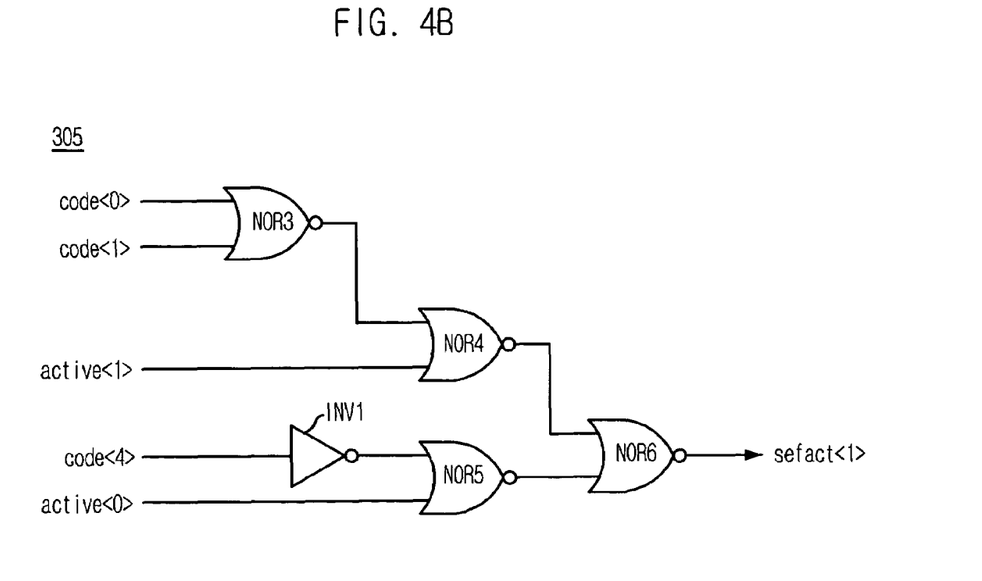

As shown in FIG. 4B, the second decoder includes a first inverter INV1 for inverting a fifth information signal code<4>, a fifth logic NOR gate NOR5 for performing a logic NOR operation to the first sequential pulse active<0> and an output of the first inverter INV1, a third logic NOR gate NOR3 for performing a logic NOR operation to the first and second information signals code<0> and code<1>, a fourth logic NOR gate NOR4 for performing a logic NOR operation to a second sequential pulse active<1> and an output of the third logic NOR gate NOR3, wherein the second sequential pulse active<1> is activated after terminating an activation period of the first sequential pulse active<0>, and a sixth logic NOR gate NOR6 for performing a logic NOR operation to outputs of the fourth and fifth logic NOR gates NOR4 and NOR5 to thereby generate a second bit signal sefact<1> of the refresh enable signal sefact<0:3>.

Figure 4C:
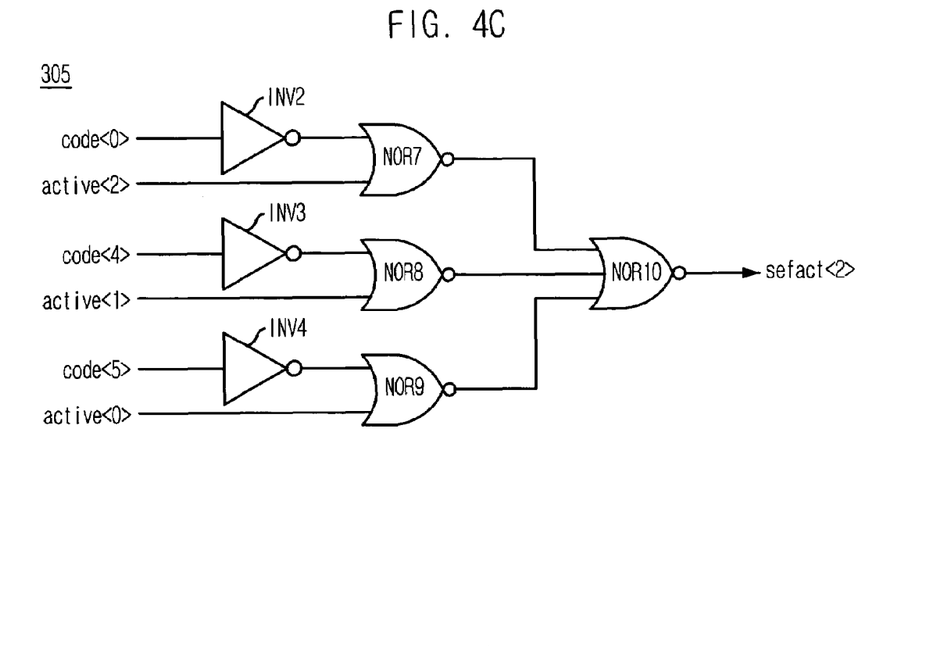

Referring to FIG. 4C, the third decoder includes a fourth inverter INV4 for inverting a sixth information signal code<5>, a ninth logic NOR gate NOR9 for performing a logic NOR operation to the first sequential pulse active<0> and an output of the fourth inverter INV4, a third inverter INV3 for inverting a fifth information signal code<4>, an eighth logic NOR gate NOR8 for performing a logic NOR operation to the second sequential pulse active<1> and an output of the third inverter code<4>, a second inverter INV2 for inverting the first information signal active<2>, a seventh logic NOR gate NOR7 for performing a logic NOR operation to a third sequential pulse active<2> and an output of the second inverter code<0>, wherein the third sequential pulse active<2> is activated after a timing of terminating an activation period of the second sequential pulse active<1> and a tenth logic NOR gate NOR10 for performing a logic NOR operation to outputs of the seventh, eighth, and ninth logic NOR gates NOR7, NOR8 and NOR9 to thereby a third bit signal sefact<2> of the refresh enable signal sefact<0:3>.

Figure 4D:
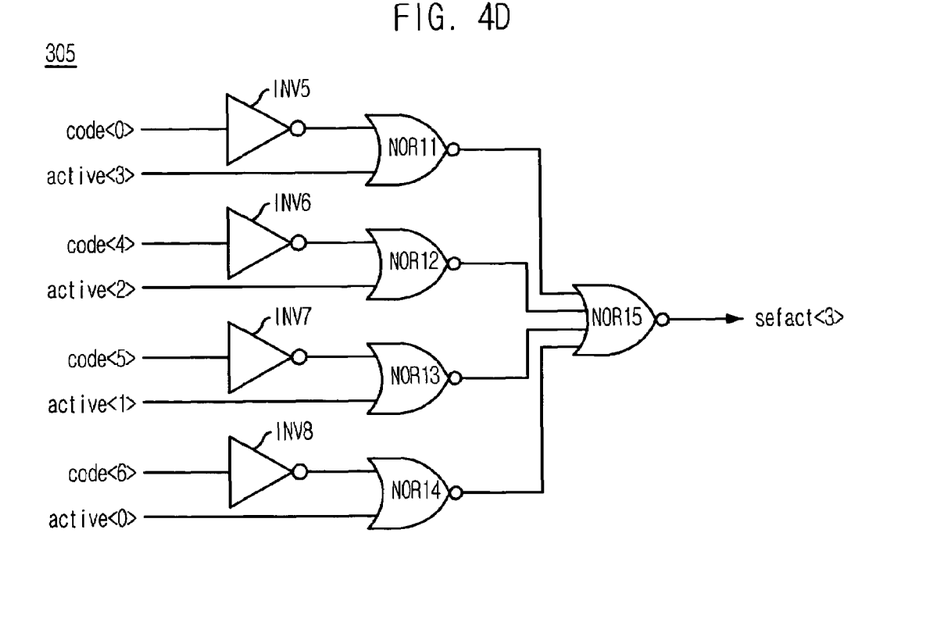

Referring to FIG. 4D, the fourth decoder includes an eighth inverter INV8 for inverting a seventh information signal code<6>, a fourteenth logic NOR gate NOR14 for performing a logic NOR operation to the first sequential pulse active<0> and an output of the eighth inverter INV8, a seventh inverter INV7 for inverting the sixth information signal code<5>, a thirteenth logic NOR gate NOR13 for performing a logic NOR operation to the second sequential pulse active<1> and an output of the seventh inverter INV7, a sixth inverter INV6 for inverting the fifth information signal code<4>, a twelfth logic NOR gate NOR12 for performing a logic NOR operation to the third sequential pulse active<1> and an output of the sixth inverter INV6, a fifth inverter INV5 for inverting the first information signal code<0>, a eleventh logic NOR gate NOR11 for performing a logic NOR operation to a fourth sequential pulse active<3> and an output of the fifth inverter INV5, wherein the fourth sequential pulse active<3> is activated after a timing of terminating an activation period of the third sequential pulse active<2> and a fifteenth logic NOR gate NOR15 for performing a logic NOR operation to outputs of the eleventh, twelfth, thirteenth, and fourteenth logic NOR gates NOR11, NOR12, NOR 13 and NOR14 to thereby generate a fourth bit signal sefact<3> of the refresh enable signal sefact<0:3>.

Herein, when second to fourth banks among four banks is refreshed, detailed description how the first to fourth decoders included in the refresh enable signal generator 305 operates for generating the refresh enable signal sefact<0:3>.

First, the self refresh pulse generator 301 outputs the self refresh pulse srefreq to the self refresh signal generator 305, and the EMRS 303 selects the fifth information signal code<4> among the array self refresh code code<0:7> described above in table 1 and outputs the fifth information signal code<4> to the self refresh signal generator 305.

Then, the self refresh signal generator 305 generates the first to third sequential pulse active<0:3> for sequentially performing a refresh operation to each bank in response to the self refresh pulse srefreq. Herein, since each of the first to third sequential pulse active<0:3> is delayed respectively, each of the first to third sequential pulse active<0:3> is respectively and sequentially activated.

When the second to fourth banks are selected for the refresh operation by the fifth information signal code<4>, the first information signal code<0> input to the first decoder becomes a logic high level, the second information signal code<1> becomes a logic high level and the third information signal code<2> becomes a logic low level. The first to third information signals code<0:2> are determined by the fifth information signal code<4> output from the EMRS 103. That is, if at least one selected bank contained in one of the first to third information signals code<0:2> is the same as selected banks contained in the fifth information signal code<4> output from the EMRS 103, the corresponding information signal becomes a logic high level; otherwise, if any selected banks contained in one of the first to third information signals code<0:2> are not the same as selected banks contained in the fifth information signal code<4> output from the EMRS 103, the information signal becomes a logic low level.

In detail, as compared with the fifth information signal code<4>, the second information signal code<1> includes a refresh operation to first and second banks; thus, since the fifth and second information signals code<4> and code<1> commonly have the refresh operation to the second bank, the second information signal code<2> is activated. In another case, the third information signal code<2> has the refresh operation to only the first bank; as compared with fifth information signal code<4>, the third information signal code<2> is inactivated because there is no refresh information to a common bank between the fifth and third information signals code<4> and code<2>.

Finally, in the first decoder shown in FIG. 4A, the first bit signal sefact<0> of the refresh enable signal sefact<0:3> becomes a logic low level, based on the first sequential pulse active<0> being a logic high level and the first to third information signals code<0:2>. Thus, there is no refresh operation in the first bank corresponding to the first bit signal sefact<0>.

Therefore, the refresh operation to banks not contained in the fifth information signal code<4> output from the EMRS 103 is not performed.

Likewise, the second decoder generates the second bit signal sefact<1> based on the first, second and fifth information signal code<0>, code<1> and code<4> and the first and second sequential pulses active<0> and active<1>. When the fifth information signal code<4> is in logic high level, the first and second information signals code<0> and code<1> become a logic high level. These signals are combined logically according to logic gate elements in the second decoder to thereby generate the second bit signal sefact<1>. Herein, the second sequential pulse active<1> is activated after a predetermined time from a termination of activation period of the first sequential pulse active<0>. This means that the second bit signal sefact<1> is generated after a predetermined time from a timing of generating the first bit signal sefact<0>.

Like the first and second decoders, the third and fourth decoders receive plural information signals based on the fifth information signal code<4> and plural sequential pulses activated in sequence and generate the third and fourth bit signals sefact<2> and sefact<3>.

As above described, in the conventional semiconductor memory device, if the refresh operation is performed to all banks after it is determined whether the refresh operation is performed to all bank or not, the refresh operation is performed to each bank in sequence for reducing the peak current; otherwise, if the refresh operation is performed to some banks, not all banks, the refresh operation is performed to some banks substantially simultaneously. Accordingly, when some banks are refreshed, the refresh operation is simultaneously performed and increases the peak current to thereby consume a large power momentarily. However, in the present invention, the refresh operation is sequentially performed to each bank regardless of which the refresh operation is required for all banks or some banks; thus, the semiconductor memory device can reduce a peak current.

Referring to FIGS. 3 to 4D, the semiconductor memory device is operated by most of control signals which are activated or enabled as a logic high level. However, if the control signals are activated when the control signal becomes a logic low level, logic gates of the bank refresh block can be substituted with other logic gates for supporting a sequential bank refresh operation regardless of whether all banks are refreshed or not.

As above described, the present invention supports a refresh operation performed sequentially to each bank when all or some banks in the semiconductor memory device require the refresh operation; as a result, peak current is reduced.

Therefore, according to the present invention, stability and reliability of the semiconductor memory device operated in a low power system can be guaranteed.

The present application contains subject matter related to the Korean patent applications Nos. KR 2005-0090941 and KR 2006-0049139, filed in the Korean Patent Office on Sep. 29, 2005 and on May 31, 2006 respectively, the entire contents of which being incorporated herein by references.

While the present invention has been described with respect to certain specific embodiments, it will be apparent to those skilled in the art that various changes and modifications may be made without departing from the spirit and scope of the invention as defined in the following claims.

What is claimed is:

1. A semiconductor memory device, comprising:
   a plurality of banks;
   an extended mode register set containing refresh information of each bank; and
   a bank refresh block for supporting a refresh operation performed in sequence to each bank of selected banks fewer in number than said plurality of banks.

2. The semiconductor memory device as recited in claim 1, wherein the extended mode register set generates an array self refresh code comprising plural information signals, each including the refresh information of each bank.

3. The semiconductor memory device as recited in claim 2, wherein the extended mode register set generates both the array self refresh code and a bank selection signal for selecting a bank which is refreshed corresponding to the array self refresh code.

4. The semiconductor memory device as recited in claim 3, wherein the bank refresh block includes:
   a refresh pulse generator for generating a refresh pulse in response to a refresh command;
   a refresh enable signal generator for generating a refresh enable signal based on the refresh pulse and the array self refresh code, wherein the refresh enable signal comprises plural bit signals activated in sequence; and
   a bank refresh control block for performing the refresh operation responsive to the refresh enable signal to one or more banks selected by the bank selection signal.

5. The semiconductor memory device as recited in claim 4, wherein the refresh enable signal generator includes:
   a sequential pulse generator for generating plural sequential pulses based on a refresh pulse; and
   first to fourth decoders, each generating the bit signal based on the plural sequential pulses and the array self refresh code.

6. The semiconductor memory device as recited in claim 5, wherein the first decoder includes:
   a first logic NOR gate for performing a logic NOR operation to first to third information signals among the array self refresh code; and
   a second logic NOR gate for performing a logic NOR operation to a first sequential pulse and an output of the first logic NOR gate to thereby generate a first bit signal of the refresh enable signal.

7. The semiconductor memory device as recited in claim 6, wherein the second decoder includes:
   a first inverter for inverting a fifth information signal;
   a fifth logic NOR gate for performing a logic NOR operation to the first sequential pulse and an output of the first inverter;
   a third logic NOR gate for performing a logic NOR operation to the first and second information signals;
   a fourth logic NOR gate for performing a logic NOR operation to a second sequential pulse and an output of the third logic NOR gate, wherein the second sequential pulse is activated after a timing of terminating an activation period of the first sequential pulse; and
   a sixth logic NOR gate for performing a logic NOR operation to outputs of the fourth and fifth logic NOR gates to thereby generate a second bit signal of the refresh enable signal.

8. The semiconductor memory device as recited in claim 7, wherein the third decoder includes:
   a fourth inverter for inverting a sixth information signal;
   a ninth logic NOR gate for performing a logic NOR operation to the first sequential pulse and an output of the fourth inverter;
   a third inverter for inverting a fifth information signal;

an eighth logic NOR gate for performing a logic NOR operation to the second sequential pulse and an output of the third inverter;
a second inverter for inverting the first information signal;
a seventh logic NOR gate for performing a logic NOR operation to a third sequential pulse and an output of the second inverter, wherein the third sequential pulse is activated after a timing of terminating an activation period of the second sequential pulse; and
a tenth logic NOR gate for performing a logic NOR operation to outputs of the seventh, eighth, and ninth logic NOR gates to thereby generate a third bit signal of the refresh enable signal.

9. The semiconductor memory device as recited in claim 8, wherein the fourth decoder includes:
an eighth inverter for inverting a seventh information signal;
a fourteenth logic NOR gate for performing a logic NOR operation to the first sequential pulse and an output of the eighth inverter;
a seventh inverter for inverting the sixth information signal;
a thirteenth logic NOR gate for performing a logic NOR operation to the second sequential pulse and an output of the seventh inverter;
a sixth inverter for inverting the fifth information signal;
a twelfth logic NOR gate for performing a logic NOR operation to the third sequential pulse and an output of the sixth inverter;
a fifth inverter for inverting the first information signal;
a eleventh logic NOR gate for performing a logic NOR operation to a fourth sequential pulse and an output of the fifth inverter, wherein the fourth sequential pulse is activated after a timing of terminating an activation period of the third sequential pulse; and
a fifteenth logic NOR gate for performing a logic NOR operation to outputs of the eleventh, twelfth, thirteenth, and fourteenth logic NOR gates to thereby generate a fourth bit signal of the refresh enable signal.

10. The semiconductor memory device as recited in claim 1, wherein the bank refresh block includes:
a refresh enable signal generator for generating a refresh enable signal based on a refresh command and the array self refresh code, wherein the refresh enable signal comprises plural bit signals activated in sequence; and
a bank refresh control block for performing the refresh operation responsive to the refresh enable signal to one or more banks selected by the bank selection signal.

11. The semiconductor memory device as recited in claim 10, wherein the refresh enable signal generator includes:
a sequential pulse generator for generating plural sequential pulses based on a refresh pulse; and
first to fourth decoders, each generating the bit signal based on the plural sequential pulses and the array self refresh code.

12. The semiconductor memory device as recited in claim 11, wherein the first decoder includes:
a first logic NOR gate for performing a logic NOR operation to first to third information signals among the array self refresh code; and
a second logic NOR gate for performing a logic NOR operation to a first sequential pulse and an output of the first logic NOR gate to thereby generate a first bit signal of the refresh enable signal.

13. The semiconductor memory device as recited in claim 12, wherein the second decoder includes:
a first inverter for inverting a fifth information signal;
a fifth logic NOR gate for performing a logic NOR operation to the first sequential pulse and an output of the first inverter;
a third logic NOR gate for performing a logic NOR operation to the first and second information signals;
a fourth logic NOR gate for performing a logic NOR operation to a second sequential pulse and an output of the third logic NOR gate, wherein the second sequential pulse is activated after a timing of terminating an activation period of the first sequential pulse; and
a sixth logic NOR gate for performing a logic NOR operation to outputs of the fourth and fifth logic NOR gates to thereby generate a second bit signal of the refresh enable signal.

14. The semiconductor memory device as recited in claim 13, wherein the third decoder includes:
a fourth inverter for inverting a sixth information signal;
a ninth logic NOR gate for performing a logic NOR operation to the first sequential pulse and an output of the fourth inverter;
a third inverter for inverting a fifth information signal;
an eighth logic NOR gate for performing a logic NOR operation to the second sequential pulse and an output of the third inverter;
a second inverter for inverting the first information signal;
a seventh logic NOR gate for performing a logic NOR operation to a third sequential pulse and an output of the second inverter, wherein the third sequential pulse is activated after a timing of terminating an activation period of the second sequential pulse; and
a tenth logic NOR gate for performing a logic NOR operation to outputs of the seventh, eighth, and ninth logic NOR gates to thereby generate a third bit signal of the refresh enable signal.

15. The semiconductor memory device as recited in claim 14, wherein the fourth decoder includes:
an eighth inverter for inverting a seventh information signal;
a fourteenth logic NOR gate for performing a logic NOR operation to the first sequential pulse and an output of the eighth inverter;
a seventh inverter for inverting the sixth information signal;
a thirteenth logic NOR gate for performing a logic NOR operation to the second sequential pulse and an output of the seventh inverter;
a sixth inverter for inverting the fifth information signal;
a twelfth logic NOR gate for performing a logic NOR operation to the third sequential pulse and an output of the sixth inverter;
a fifth inverter for inverting the first information signal;
a eleventh logic NOR gate for performing a logic NOR operation to a fourth sequential pulse and an output of the fifth inverter, wherein the fourth sequential pulse is activated after a timing of terminating an activation period of the third sequential pulse; and
a fifteenth logic NOR gate for performing a logic NOR operation to outputs of the eleventh, twelfth, thirteenth, and fourteenth logic NOR gates to thereby generate a fourth bit signal of the refresh enable signal.

* * * * *